United States Patent [19]

McRae

[11] 4,161,628
[45] Jul. 17, 1979

[54] TECHNIQUE FOR TRACKING AMPLITUDE FADES FOR MULTI-AMPLITUDE SIGNALLING

[75] Inventor: Daniel D. McRae, West Melbourne, Fla.

[73] Assignee: Harris Corporation, Melbourne, Fla.

[21] Appl. No.: 873,834

[22] Filed: Jan. 31, 1978

[51] Int. Cl.² .......................... H04J 3/04; H04B 1/10
[52] U.S. Cl. .............................. 179/15 BL; 178/69 A;
325/326; 328/162; 340/15.5 GC; 340/146.1 R
[58] Field of Search ....................... 328/162, 163, 164;
179/15 A, 15 BL; 178/66, 69 A; 340/146.1 R,
15.5 GC, 15.5 AC; 325/38 R, 42, 310, 34, 326

[56] References Cited
U.S. PATENT DOCUMENTS

| | | | |
|---|---|---|---|
| 3,225,213 | 12/1965 | Hinrichs et al. | 178/69 A |
| 3,619,503 | 11/1971 | Ragsdale | 178/66 R |
| 3,633,108 | 1/1972 | Kneuer | 325/326 |
| 3,736,511 | 5/1973 | Gibson | 325/321 |
| 3,851,266 | 11/1974 | Conway | 328/162 |
| 4,034,340 | 7/1977 | Sant'Agostino | 340/146.1 R |

Primary Examiner—Thomas A. Robinson
Attorney, Agent, or Firm—Craig and Antonelli

[57] ABSTRACT

Amplitude variations in a multi-amplitude transmission system are tracked by monitoring amplitude variations over a substantial data time span through the use of a technique in which the percentage of time that a maximum-valued reference amplitude is exceeded is made equal to the percentage of time that a minimum-valued amplitude is not obtained. For this purpose, received data samples are multiplied by an adjustable gain constant to obtain an amplitude product. The amplitude product is then compared with reference values corresponding to the maximum and minimum amplitudes. If the amplitude product exceeds the maximum amplitude reference, the gain constant is decreased, and if the amplitude product is smaller than the minimum amplitude reference, the gain constant is increased. To implement this technique on a percentage basis, a storage device, such as an up/down counter, is loaded with a prescribed number corresponding to the percentage range over which the gain adjustment is measured and the contents of the counter are controllably incremented or decremented depending upon received gain products. Modification of the gain constant can be in accordance with a fixed value or one which is a function of the difference between the amplitude product and the maximum or minimum reference values.

11 Claims, 4 Drawing Figures

TECHNIQUE FOR TRACKING AMPLITUDE FADES FOR MULTI-AMPLITUDE SIGNALLING

FIELD OF THE INVENTION

The present invention is directed to data communication systems and particularly relates to a technique of tracking amplitude variations in a multi-amplitude transmission system.

BACKGROUND OF THE INVENTION

In the field of high speed data communications, modems employed for transmitting information often are of the type which perform multi-amplitude signalling, wherein plural amplitude levels are used to designate respective information states. Where telephone lines and associated telephone equipment form part of the transmission medium, amplitude fading and distortion constitute significant impairment to the accurate reconstruction of transmitted signals, and the higher the transmission rate the more complex the problem becomes. A common piece of receiver equipment in amplitude modulation signalling systems is gain correction or gain control circuitry which monitors variations in the amplitudes of received signals and adjusts the received signal amplitude in accordance with some preestablished gain control function. Because of the wide variety of modulation schemes which may be adopted, the gain adjustment circuitry is normally tailored for a particular data modulation technique.

For example, where data is transmitted in binary or digital format, the receiver circuitry will commonly incorporate threshold detection circuitry with reference level adjustments to provide corrective action for amplitude tracking. One such system is described in the U.S. patent to Sant'Agostino U.S. Pat. No. 4,034,340 which relates to a system which monitors multi-amplitude signals, such as binary or digital messages, and compares the received signal amplitudes at prescribed time intervals with established threshold levels. There is a maximum level and a minimum level relative to which pseudo-error values may be defined. The maximum and minimum levels themselves define a medium threshold relative to which a signal sample is determined to be either a "1" or a "0." A comparator network is employed to determine whether or not one of threshold values should be moved to maintain a substantially constant pseudo-error rate.

The U.S. patent to Gibson U.S. Pat. No. 3,736,511 describes a further type of adjustable threshold decision circuit, wherein signal samples are compared against a set of adjustable reference levels and a decision is made as to the value of each signal sample as well as the sign of the sample. Adjustment of the threshold levels is made in accordance with a set of algorithms which effectively take the difference between a set of samples and store the same.

Another threshold adjustment system is described in the U.S. patent to Sullivan U.S. Pat. No. 3,665,326 which relates to the control of the threshold level in a digital data sampling system to maintain a prescribed percentage of "1" bits.

In addition to particularly tailored threshold adjustment amplitude tracking circuitry, there are known amplitude detection circuits which vary the gain in accordance with amplitude deviations from established zones or regions. For example, the U.S. patent to Ragsdale U.S. Pat. No. 3,619,503 describes a technique of overcoming distortion in a multi-amplitude, multi-phase telephone transmission line-coupled modem, wherein upper and lower ranges for establishing amplitude levels are employed for the control of the gain of the system depending upon the amplitude of the signals relative to those ranges and logic levels separating the ranges from each other. If the amplitude of the signal is fairly close to one of the logic levels in the intermediate ranges, the gain is adjusted in the appropriate direction to bring the amplitude of the signal to the prescribed logic level. If the amplitude falls in an outer level, namely the amplitude level is extremely large, there is a rapid decrease in the gain level.

Another type of gain control system is described in the U.S. patent to Conway U.S. Pat. No. 3,851,266 which relates to a system for adjusting the gain and DC level of a signal measuring circuit in accordance with whether or not a signal exceeds or is less than maximum and minimum threshold values. If a signal sample is positive and greater than some upper threshold level, the gain is reduced; however, if the positive sample is less than this upper threshold, the gain is increased. If, on the other hand, the signal sample is negative and greater, in absolute value, than the minimum threshold representing the lower level, a positive bias is added to increase the DC level. A technique similar to this is discussed in the U.S. patent to Tracey et al U.S. Pat. No. 3,864,529 which shows another type of multi-amplitude signal processing system wherein the gain of the system is adjusted depending upon where the amplitude of a signal sample falls. An amplitude scale is broken-up into zones and either increase or decrease gain signals are generated depending upon whether or not the signal amplitudes exceed or are less than zone threshold levels.

In each of the above systems, the gain adjustment technique described is particularly related to the modulation and transmission scheme employed and may not have wide application or be suited to other types of transmission systems wherein the type of modulation employed or the data rate are considerably different. Moreover, in prior art amplitude tracking schemes which use adjustment error signals from decided upon amplitudes as a basis for adjusting gain, there exists the problem of hang-up modes rendering such techniques substantially useless.

SUMMARY OF THE INVENTION

In accordance with the present invention, rather than employ a threshold adjustment scheme or track amplitude variations on a sample by sample basis, amplitude variations in a multi-amplitude transmission system are tracked by monitoring amplitude variations over a substantial data time span through the use of a technique in which the percentage of time that a maximum-valued reference amplitude is exceeded is made equal to the percentage of time that a minimum-valued amplitude is not obtained. For this purpose, received data samples are multiplied by an adjustable gain constant to obtain an amplitude product. The amplitude product is then compared with reference values corresponding to the maximum and minimum amplitudes. If the amplitude product exceeds the maximum amplitude reference, the gain constant is decreased, and if the amplitude product is smaller than the minimum amplitude reference, the gain constant is increased. To implement this technique on a percentage basis, a storage device, such as an up-/down counter, is loaded with a prescribed number corresponding to the percentage range over which the gain adjustment is measured and the contents of the counter are controllably incremented or decremented depending upon received gain products. Modification of the gain constant can be in accordance with a fixed value or one which is a function of the difference between the amplitude product and the maximum or minimum reference values.

DETAILED DESCRIPTION

Figure 1:
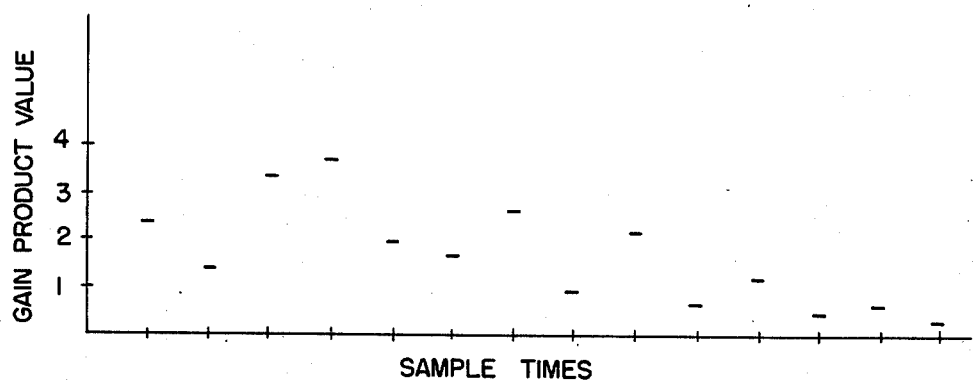
FIG. 1 is a diagram illustrating a sequence of received data samples subjected to fading with the passage of time.

FIG. 1 shows a temporal plot of a series of gain product values corresponding to data levels capable of being transmitted in a multi-amplitude transmission system. The vertical axis depicts four amplitude product levels which result from multiplying a fixed gain constant by four equi-spaced, respective amplitude signal levels. The maximum amplitude product is level 4 and the minimum level product is level 1, each value being of the same polarity and non-zero. FIG. 1 also depicts signal degradation, specifically, amplitude decrease, with the lapse of time as may result from signal fading at the receiver.

In accordance with the present invention, the gain constant by which received signal amplitudes are multiplied is adjusted on a percentage basis. Namely, the percentage of time that the maximum amplitude product is exceeded is made equal to the percentage of time that the minimum amplitude product is not obtained, over a prescribed number of samples, or time intervals.

Figure 2:
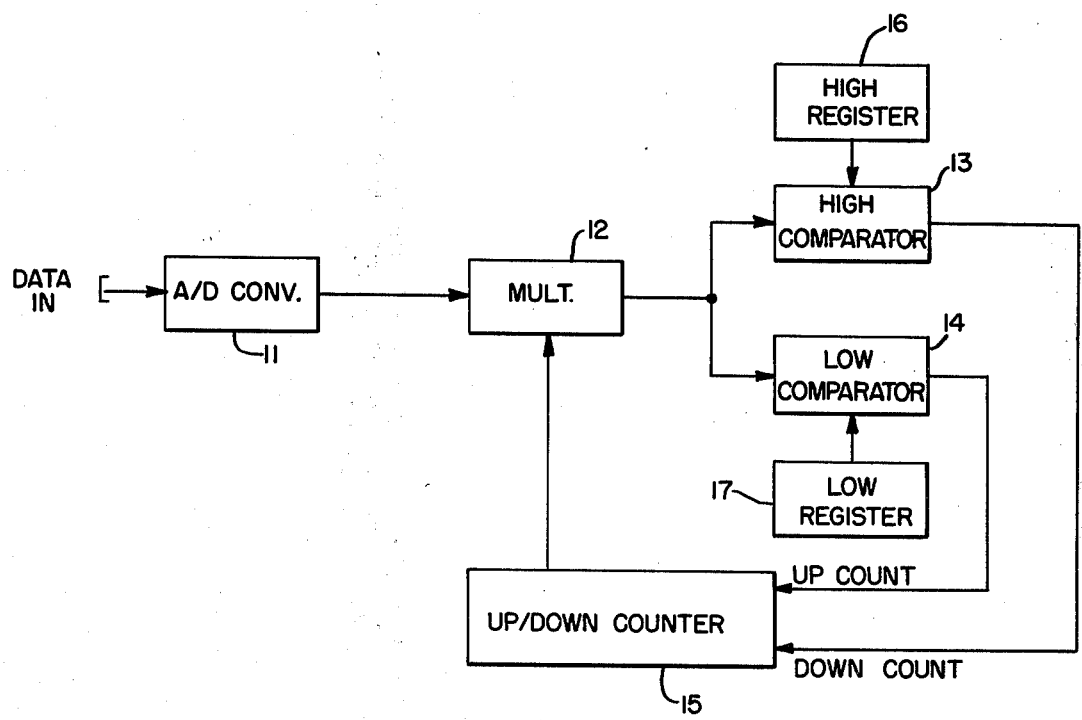
FIG. 2 is a schematic diagram of an embodiment of an amplitude tracking system in accordance with the present invention.

FIG. 2 illustrates an exemplary digital configuration for implementing the percentage-basis technique in accordance with the present invention.

A received multi-amplitude data sequence, each data portion of which is transmitted at one of a plurality of separate like-polarity non-zero values, is applied to an analog-to-digital converter 11 which converts the analog value of the received signal value to digital format. The digital value is then applied to multiplier 12 wherein it is multiplied by a gain constant supplied from selected stages of an up/down counter 15. Up/down counter 15 may be a ten-stage counter with the five least significant bit stages being used to average the gain adjustment over the most recent five bits or thirty-two data sample intervals. The five upper, or most significant, stages of counter 15 are coupled to multiplier 12 and constitute its second input to be multiplied by the output of A/D converter 11. The output of multiplier 12 corresponds to the amplitude product to be compared with the maximum and minimum amplitude reference values for adjusting the gain constant produced by up/down counter 15.

The output of multiplier 12 is coupled to a high-value comparator 13 and a low-value comparator 14. A second input of comparator 13 is coupled to register 16, storing a presettable high-reference value, such as one corresponding to the maximum amplitude reference (4) shown in FIG. 1, while a second input of comparator 14 is coupled to register 17, storing a presettable low-reference value, such as one corresponding to the minimum amplitude reference (1) shown in FIG. 1. High-value comparator 13 compares the output of multiplier 12 with the maximum amplitude reference and supplies a decrement-count signal to counter 15 whenever the output of multiplier 12 exceeds the maximum amplitude value. Low-value comparator 14 compares the output of multiplier 12 with the minimum amplitude reference and supplies an increment-count signal to counter 15 where the output of multiplier 12 is less than the minimum amplitude value.

Considering now the operation of the amplitude tracking circuit shown in FIG. 2, for the purposes of initially setting the gain product by up/down counter 15, a training or pre-data transmission sequence may be transmitted to the receiver. Up/down counter 15 may be reset or loaded to capacity or any suitable gain such as unity (00001 00000 for the example given). To better illustrate the effect of up/down counter 15, let it be assumed that the counter is initially cleared or reset, so that its ten stages contain all zeros (00000 00000). The first received data sample value from A/D converter 11 will be multiplied by the digital value of the five most significant bits of counter 15 (00000) and multiplier 12 will produce a product of zero at its output. This quantity is then compared with the maximum and minimum amplitude references by comparators 13 and 14, respectively. Since the value 00000 is less than the maximum amplitude reference, no decrement-count signal is supplied by comparator 13 to counter 15. Instead, since the minimum amplitude reference is non-zero, comparator 14 supplies an increment-count signal to counter 15 and its count value becomes 00000 00001. The gain defined by the five most significant bits is still zero, so for the next thirty-one data samples, counter 15 will be incremented until the gain multiplier provided by counter 15 becomes 00001 or non-zero. Then, if the product of the amplitude of the thirty-third data sample times 00001 falls within the limits set for comparators 13 and 14, counter 15 will be neither incremented nor decremented. If however, the product of the amplitude of the thirty-third data sample times 00001 is outside the limits set for comparators 13 and 14, an increment or decrement count signal will be supplied to counter 15, as necessary to adjust the gain. Usually, counter 15 will continue being incremented by comparator 14 until the gain defined by the five most significant bits of counter 15 reaches an average value based upon the percentage deviation criterion described above and the digital gain will then be subject to incremental changes at each new data sample but based upon the gain products of previously received data samples.

Figure 3:
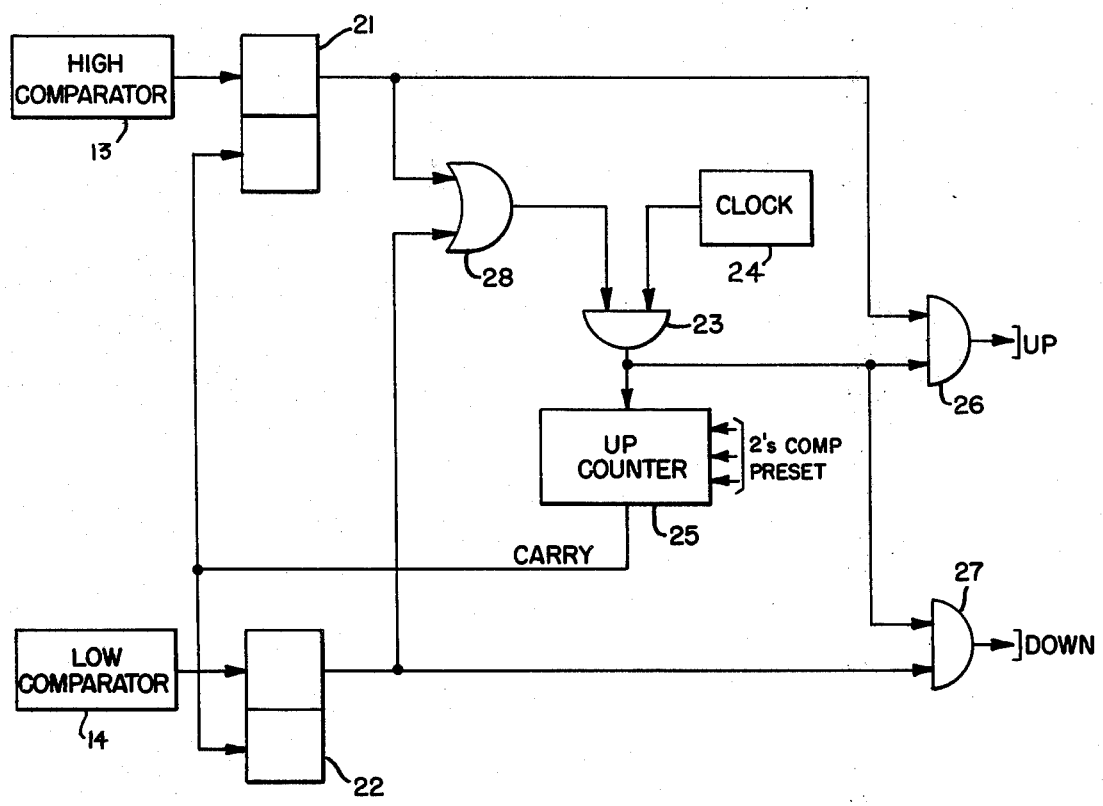
FIG. 3 is a schematic diagram of a modification of the embodiment of an amplitude tracking system shown in FIG. 2.

In the foregoing embodiment, up/down counter 15 is incremented or decrementd by a single digit in response to an enable signal from the appropriate one of comparators 13 and 14. However, the degree of change of counter 15 need not be limited to a single digit but may be set at any desired constant value. An exemplary implementation of changing the contents of counter 15 by a prescribed non-single digit count is shown in FIG. 3.

Rather than being coupled directly to the respective down and up count control inputs of counter 15, the outputs of comparators 13 and 14 are respectively coupled to the set inputs of flip-flops 21 and 22. The set outputs of flip-flops 21 and 22 are, in turn, coupled to respective inputs of OR gate 28 and to an input of AND gates 26 and 27. The output of OR gate 28 is connected to one input of AND gate 23, another input of which is coupled to receive clock pulses from clock source 24. The output of AND gate 23 is coupled to the count input of up-counter 25 and to each of AND gates 26 and 27. The carry output of counter 25 is coupled to the inputs of flip-flops 21 and 22. Up-counter 25 may be preset by selective strapping of two's complement input terminals in a conventional fashion so that counter 25 counts up from its preset number and carries to that number upon recycling. Thus, assuming counter 25 is a three-bit counter (having a count capacity of eight), the constant value by which up/down counter 15 in FIG. 1 may be incremented or decremented will have a maximum value of eight. Let it be assumed that, in response to an output by one of comparators 13 and 14, up/down counter 15 is to be incremented by a count of five or (101). Thus, the two's complementary strapping of counter 25 would input a three or (011) at its presettable inputs so that counter 25 will count from 011 to 111 and recycle or carry over to 011.

In operation, in response to an output from one of comparators 13 and 14, one of flip-flops 21 and 22 will be placed in the set state, the other flip-flop remaining in the reset state into which it was placed at the last carry output of up-counter 25. The set output of one of flip-flops 21 and 22 will enable AND gate 23, via OR gate 28, so that AND gate 23 will begin coupling clock pulses from clock source 24 to counter 25. These clock pulses are also supplied to AND gates 26 and 27, one of which has been enabled by the set output of the appropriate one of flip-flops 21 and 22. These clock pulses are supplied to one of the up or down count inputs of counter 15 to change its stored count value by one bit for each clock pulse counted. Depending upon the total contents of all its stages, the gain value supplied to multiplier 12 may also be varied.

Upon up-counter 25 counting up to 111 and recycling to 011, a carry signal is generated, which resets flip-flops 21 and 22 and thereby disables AND gates 23, 26, and 27 to inhibit the supply of further clock pulses to counter 15, until a further data signal produces an amplitude product causing one of comparators 13 and 14 to produce an output and set one of flip-flops 21 and 22.

Figure 4:
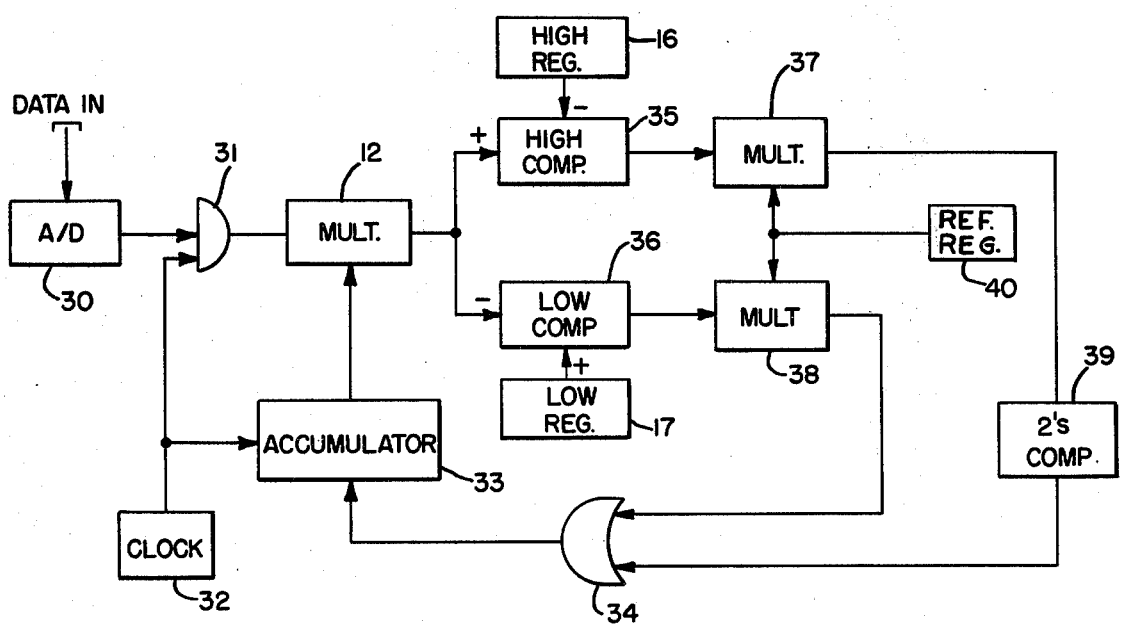
FIG. 4 is a schematic diagram of a further embodiment of an amplitude tracking system in accordance with the present invention.

FIG. 4 illustrates an embodiment of the present invention wherein the amount of modification of the gain coefficient is a function of the difference between the received product and the maximum and minimum reference values. Incoming data samples are converted into digital format in a suitable A/D converter 30 and are applied to gate circuit 31, shown in FIG. 4 as an AND gate. It should be understood that like FIG. 2, the single conductor leads shown in FIG. 4 are for the purpose of simplifying the drawing and the appropriate number of conductors are intended thereby as necessary to couple the required digital code bits between circuit elements. Similarly, simple gate designations such as AND gate 31 may comprise the appropriate number of gate elements as necessary to couple the digital word output of A/D converter 30 to multiplier 12. Mulitiplier 12 multiplies the output of A/D converter 30, when supplied by gate 31, by the contents of accumulator 33, the contents of which are updated in accordance with the output of clock circuit 32, which also enables gates 31. Accumulator 33 may be comprised of standard adder/register circuitry and is formed of a plurality of stages, a selected upper significant number of which may be employed to designate the gain coefficient supplied to multiplier 12, as in the case with up/down counter 15 in the embodiment shown in FIG. 2.

The output of multiplier 12 is supplied to a pair of comparators 35 and 36, which compare the amplitude product output of multiplier 12 with the upper and lower reference values stored in register 16 and 17, respectively. Comparator 35 produces an output representative of the difference between its inputs if the product output of multiplier 12 exceeds the upper, or maximum, reference value stored in register 16. Similarly, comparator 36 produces an output representative of the difference between its inputs if the product output of mulitiplier 12 is less than the minimum, or lower, reference value stored in register 17. Otherwise, the output of each comparator is zero. The outputs of comparators 35 and 36 are applied to multipliers 37 and 38 wherein they are scaled by a reference factor stored in register 40. The output of multiplier 37 is converted into two's complement by two's complement circuit 39 and coupled via OR gate circuit 34 to the respective stages of accumulator 33 via OR gate circuit 34. With this configuration, the output of multiplier 37 will be subtracted from the contents of accumulator 33, while the output of multiplier 38 will be added to the contents of accumulator 33.

In operation, as each analog data sample is converted into digital format, it is coupled to multiplier 12 to be multiplied by the gain coefficient stored in accumulator 33 under the control of clock circuit 32. This received amplitude product is then compared in comparators 35 and 36 with the respective maximum and minimum reference values stored in registers 16 and 17. If the product exceeds the upper limit, or fails to reach the lower limit, one of comparators 35 and 36 will produce an output representative of the difference between the amplitude-gain product and the appropriate reference value. This difference is then scaled by one of multipliers 37 and 38 and the result is supplied to accumulator 33 to change its contents and thereby modify the gain, depending upon the degree of modification and the value of the gain represented by the selected bits coupled to multiplier 12.

As will be appreciated from the foregoing description of the invention, amplitude tracking for multi-amplitude signals is carried out on a threshold exceedence percentage basis, iterated over a prescribed number of signal sample intervals. The amount of adjustment of the gain coefficient may be either by a fixed value or as a function of the difference between the amplitude-gain product and prescribed reference values.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

I claim:

1. In a data communication system wherein transmitted data signals may occupy amplitude levels at and between upper and lower values of the same polarity, a method of adjusting the amplitudes of received data signals comprising the steps of:

multiplying the amplitude of each received data signal by an adjustable gain coefficient to obtain a gain product signal;

comparing said gain product signal with first and second reference values representative of gain products corresponding to said upper and lower values of the amplitude levels capable of being occupied by transmitted data signals; and adjusting the value of said gain coefficient so as to make the percentage of time that said first reference value is exceeded by gain product signals equal to the percentage of time that said second reference value exceeds gain product signals.

2. A method according to claim 1, wherein said adjusting step includes the steps of generating a gain coefficient representative value, increasing the magnitude of said gain coefficient representative value by a controllable amount in response to a gain product signal being less than said second reference value, and decreasing the magnitude of said gain coefficient representative value by a controllable amount in response to a gain product signal exceeding said first reference value, and producing as said adjustable gain coefficient only a prescribed upper magnitude portion of said gain coefficient representative value.

3. A method according to claim 2, wherein the controllable amount by which the magnitude of said gain coefficient representative value is increased and decreased is constant.

4. A method according to claim 2, wherein the controllable amount by which the magnitude of said gain coefficient representative value is increased and decreased is a function of the difference between the gain product signal and said second and first reference values, respectively.

5. In a data communication system wherein transmitted data signals may occupy amplitude levels at and between upper and lower values of the same polarity, and arrangement adjusting the amplitudes of received data signals comprising:

first means for multiplying the amplitude of each received data signal by an adjustable gain coefficient to obtain a gain product signal;

second means, coupled to said first means, for comparing said gain product signal with first and second reference values representative of gain products corresponding to said upper and lower values of the amplitude levels capable of being occupied by transmitted data signals; and third means, coupled to said first and second means, for adjusting the value of said gain coefficient so as to make the percentage of time that said first reference value is exceeded by gain product signals equal to the percentage of time that said second reference value exceeds gain product signals.

6. An arrangement according to claim 5, wherein said third means includes means for storing a gain coefficient representative value, means for increasing the magnitude of said gain coefficient representative value by a controllable amount in response to a gain product signal being less than said second reference value, and decreasing the magnitude of said gain coefficient representative value by a controllable amount in response to a gain product signal exceeding said first reference value, and means for producing, as said adjustable gain coefficient, only a prescribed upper magnitude portion of said stored gain coefficient representative value.

7. An arrangement according to claim 6, wherein the controllable amount by which the magnitude of said gain coefficient representative value is increased and decreased is constant.

8. An arrangement according to claim 6, wherein the controllable amount by which the magnitude of said gain coefficient representative value is increased and decreased is a function of the difference between the gain product signal and said second and first reference values, respectively.

9. An arrangement according to claim 5, wherein said third means comprises an up/down counter having a prescribed number of stages, a preselected most significant number of which are coupled to said first means for supplying said adjustable gain coefficient thereto, said up/down counter further including down and up count inputs to which respective decrement and increment count signals are selectively supplied by said second means in response to the comparison of said gain product signal with said first and second reference values.

10. An arrangement according to claim 6, wherein said storing means comprises an accumulator having a prescribed number of stages and said producing means comprises means for coupling a preselected most significant number of said stages to said first means for supplying said adjustable gain coefficient thereto.

11. An arrangement according to claim 10, wherein said increasing and decreasing means comprises means, coupled to said second means, for multiplying the difference between the gain product signal and one of said first and second reference values by a prescribed reference value and decreasing or increasing the contents of said accumulator by the product of said difference and said prescribed reference value.

* * * * *